(12) United States Patent
Jones et al.

(10) Patent No.: US 8,463,204 B2
(45) Date of Patent: Jun. 11, 2013

(54) MULTIPORT AMPLIFIERS IN COMMUNICATIONS SATELLITES

(75) Inventors: Daryl Richard Jones, Stevenage (GB); Alan David Couchman, Stevenage (GB); Michael Harverson, Stevenage (GB)

(73) Assignee: Astrium Limited, Hertfordshire (GB)

( * ) Notice: Subject to any disclaimer, the term of this patent is extended or adjusted under 35 U.S.C. 154(b) by 334 days.

(21) Appl. No.: 12/809,788

(22) PCT Filed: Dec. 19, 2008

(86) PCT No.: PCT/EP2008/068026
§ 371 (c)(1),
(2), (4) Date: Jul. 15, 2010

(87) PCT Pub. No.: WO2009/080752
PCT Pub. Date: Jul. 2, 2009

(65) Prior Publication Data
US 2010/0271121 A1  Oct. 28, 2010

(30) Foreign Application Priority Data

Dec. 21, 2007 (EP) .................................. 07270080
Dec. 21, 2007 (GB) ................................. 0724937.8

(51) Int. Cl.
*H04B 7/02* (2006.01)
(52) U.S. Cl.
USPC ......................................... 455/101; 455/304
(58) Field of Classification Search
USPC ................. 455/424, 427, 12.1, 101
See application file for complete search history.

(56) References Cited

U.S. PATENT DOCUMENTS 6,006,111 A  12/1999 Rowland
7,088,173 B1  8/2006 Rozario et al.
(Continued)

FOREIGN PATENT DOCUMENTS

EP  1 819 041 A1  8/2007
JP  2000-307428 A  11/2000
(Continued)

OTHER PUBLICATIONS

Notification Concerning Transmittal of International Preliminary Report on Patentability (Forms PCT/IB/326 and PCT/IB/373) and the Written Opinion of the International Searching Authority (Forms PCT/ISA/237) issued in corresponding International Application No. PCT/EP2008/068026 dated Jul. 1, 2010.

(Continued)

*Primary Examiner* — Tu X Nguyen
(74) *Attorney, Agent, or Firm* — Buchanan Ingersoll & Rooney PC

(57) ABSTRACT

In order to maintain isolation of signals within a multiport amplifier of a communications satellite and to reduce crosstalk components, by monitoring communications signals passing through the multiport amplifier, output signals of the multiport amplifier are sensed and downconverted to baseband, and applied to an emulator mechanism of the multiport amplifier. The emulator mechanism comprises a reverse matrix of the multiport amplifier, which recovers the input signals of the multiport amplifier together with cross-talk components, and a digital signal processor which carries out a frequency analysis of the cross-talk components by means of an FFT, and employs a digital model of the multiport amplifier to determine the state of the multiport amplifier which gives rise to such cross-talk components. The digital signal processor may be located at a ground station to which communication is made via a telemetry link.

20 Claims, 4 Drawing Sheets

U.S. PATENT DOCUMENTS

| | | | |
|---|---|---|---|
| 2005/0260947 A1* | 11/2005 | Karabinis et al. | 455/12.1 |
| 2006/0008027 A1 | 1/2006 | Gao et al. | |
| 2006/0116090 A1* | 6/2006 | Rosen et al. | 455/127.2 |
| 2008/0143562 A1 | 6/2008 | Huang et al. | |
| 2009/0141828 A1 | 6/2009 | Huang et al. | |

FOREIGN PATENT DOCUMENTS

| | | |
|---|---|---|
| JP | 2001-527318 A | 12/2001 |
| JP | 2005-269043 A | 9/2005 |
| JP | 2006-345066 A | 12/2006 |
| WO | 99/33203 A1 | 7/1999 |
| WO | WO 2005/029875 A2 | 3/2005 |

OTHER PUBLICATIONS

International Search Report (PCT/ISA/210) for PCT/EP2008/068026 mailed Apr. 7, 2009.

Written Opinion (PCT/ISA/237) for PCT/EP2008/068026 mailed Apr. 7, 2009.

European Search Report for EP 07270080.0 dated Jun. 9, 2008.

United Kingdom Search Report for GB 0724937.8 dated Apr. 17, 2008.

P. James, "Optimization of a Multi-port Amplifier Using a Least Squares Evolutionary Relaxation Method," Proceedings of the 36th European Microwave Conference, Manchester United Kingdom, Sep. 2006, pp. 886-889.

A. Couchman, et al., "Multiport Amplifiers for Ka-band Multi-beam Payloads with Amplitude/Phase Compensation," Proceedings of the 13th Ka and Broadband Communications Conference, Turin Italy, Sep. 24-26, 2007, pp. 527-534.

Office Action (Notice of Reasons for Refusal) dated Aug. 7, 2012, issued in corresponding Japanese Patent Application No. 2010-538760, and an English Translation thereof. (7 pages).

Office Action (Decision to Grant) dated Feb. 19, 2013, issued in corresponding Russian Patent Application No. 2010130426(043184). (6 pages).

* cited by examiner

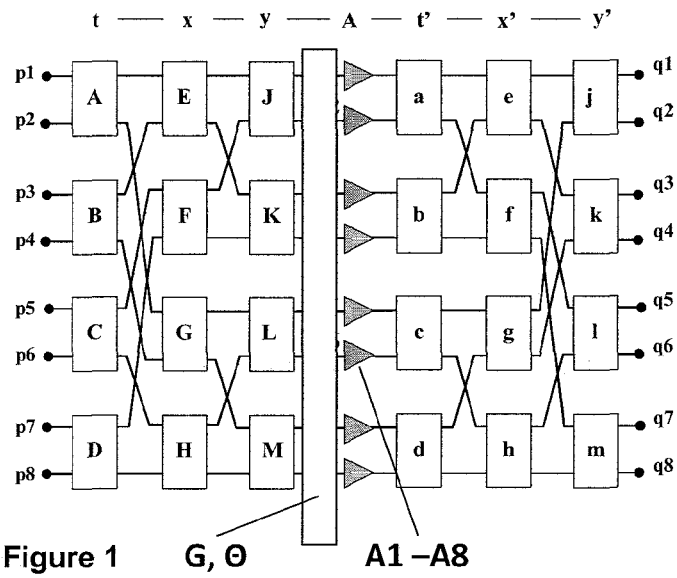
Figure 1  G, Θ    A1–A8
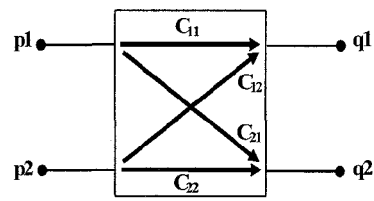
Figure 2
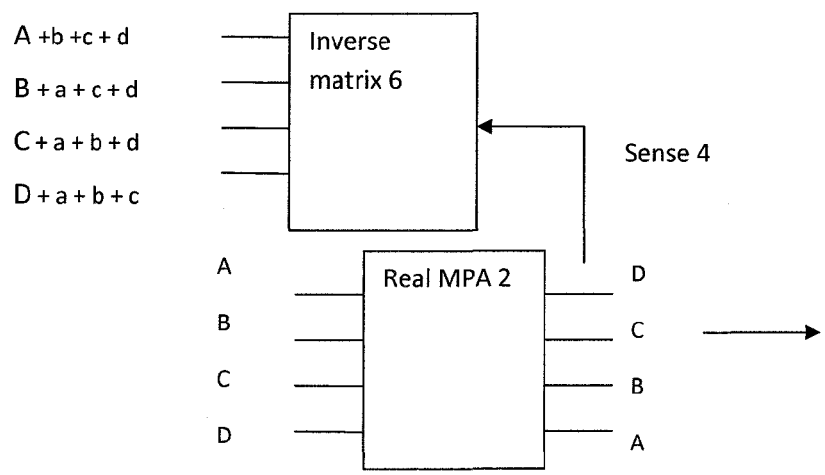
Figure 3

MULTIPORT AMPLIFIERS IN COMMUNICATIONS SATELLITES

TECHNICAL FIELD

This invention relates to multiport amplifiers for use within a satellite communication system, and specifically to a method and apparatus for maintaining isolation within multiport amplifiers.

BACKGROUND ART

In Alan Couchman, Daryl Jones, "Multiport Amplifiers for Ka-band Multi-beam Payloads with Amplitude/Phase Compensation", Proceedings of the The 13th Ka and Broadband Communications Conference, Turin Italy, Sep. 24-26, 2007, pp. 527-534, there is described multiport amplifiers (MPAs) as a means for enhancing the flexibility of Ka-band multi-beam payloads. However, at Ka-band maintenance of tracking within the MPA becomes highly challenging. A solution is the use of feedback loops located at specific points within the MPA to detect tracking errors and provide compensation. Errors are detected through measurements at "null points" in the MPA output network, with zero power corresponding to accurate tracking. The feedback loops adjust the MPA phase/gains such that the levels at these points are maintained at zero. The scheme operates with a pilot signal for null detection injected at one of the MPA inputs. The signal may be generated onboard and would be located outside the normal traffic space ensuring that the scheme would be non-invasive.

Whilst this solution is very effective at maintaining isolation, nevertheless it employs a significant amount of onboard hardware and on-board processing requirements. Since such requirements are at a premium in telecommunication satellites, further improvements in maintaining isolation within MPAs may be desirable.

An MPA is a well-known power amplifier device used for satellite communications, which operates at the microwave frequency bands. An MPA includes a number N of similar amplifier units (TWT or solid state) in parallel, each having a power P, so that each input signal is amplified equally by each amplifier, to potentially increase the power of an output signal by a factor N, to P×N. N input ports and N output ports are provided, so that an input signal on one input port is routed to the corresponding output port. The input ports are connected to the amplifier units by a low power input network (INET) that may be implemented in any convenient transmission line technology that is appropriate to the circumstances, e.g. microstrip, stripline, coaxial cable, or waveguide. The output ports are connected to the amplifier units by a high power output network (ONET) that is implemented typically using low loss transmission line technology. The ONET is mathematically a reciprocal of the INET, so that a signal presented to the nth input is directed to the nth output. Each network comprises an array of signal dividing waveguide devices. Butler matrices or networks comprising just hybrid devices are normally used for signal division, because they have convenient gain and phase shift properties. A hybrid is a four port signal dividing device comprising two inputs and two outputs, with selective 90° phase shifts; this phase difference may be exploited to improve the isolation characteristics of the networks. However other hybrids and other signal splitting devices may be used which may have 180° phase difference.

The great advantage of an MPA is that in providing access for each input port equally to each amplifier, the accessible power available to each port is N×P, where P is the power of each individual amplifier. Thus the MPA embodies a high degree of flexibility, providing a wide range of output power which can be shared dynamically and in a highly flexible manner between the N inputs (or downlink beams). However a concomitant problem with an MPA is that of cross-talk between MPA output ports, and in general a lack of isolation between signals routed through the MPA.

SUMMARY OF THE INVENTION

It is an object of the present invention to provide a multiport amplifier for a communications satellite with a method and means for maintaining isolation between signals routed through the multiport amplifier.

For the purposes of the present specification, a multiport amplifier is defined as comprising a plurality of microwave power amplifier units, a plurality of input ports and a plurality of output ports, the input ports being connected to said amplifier units by an input signal dividing network, and the output ports being connected to said amplifier units by an output signal dividing network, so that an input signal at any input port is amplified, equally in normal or typical circumstances, by all amplifier units, and then recombined into an output signal at an output port: such multiport amplifier will be referred to as a "multiport amplifier as defined herein".

In a first aspect, the invention provides a method of adjusting the gain and/or phase characteristics of a multiport amplifier of a communications satellite to improve the isolation of signals within the multiport amplifier, the multiport amplifier comprising a plurality of microwave power amplifier units, a plurality of input ports and a plurality of output ports, the input ports being connected to said amplifier units by an input signal dividing network, and the output ports being connected to said amplifier units by an output signal dividing network, so that an input signal at any input port is amplified by all amplifier units, and then recombined into an output signal at an output port, the method comprising:

providing at least one of said amplifier units with gain adjusting means and phase adjusting means, providing input signals into at least some of said input ports, and detecting resultant output signals at least some of said output ports, providing detected versions of said output signals to a multiport amplifier emulation means, said emulation means emulating characteristics of the multiport amplifier so as to enable cross-talk components within said detected versions to be assessed, and in response thereto issuing as required adjusting commands to said gain adjusting means and/or phase adjusting means.

In a further aspect, the invention provides a multiport amplifier arrangement for a communications satellite, comprising a plurality of microwave power amplifier units, a plurality of input ports and a plurality of output ports, the input ports being connected to said amplifier units by an input signal dividing network, the output ports being connected to said amplifier units by an output signal dividing network, so that an input signal at any input port is amplified, by all amplifier units, and then recombined into an output signal at an output port, and at least one of said amplifier units having gain adjusting means and phase adjusting means, means for detecting output signals at said output ports and for providing detected versions of said detected output signals to a multiport amplifier emulation means, said emulation means for emulating characteristics of the multiport amplifier arrangement so as to enable cross-talk components within said detected versions to be assessed, and being arranged to provide adjusting commands to said gain adjusting means and/or phase adjusting means.

Since in accordance with the present invention, the condition of the multiport amplifier may be assessed and adjusted as required using communications input signals and output signals that occur in use of the multiport amplifier, it is unnecessary to provide and detect specific sequences of pilot tones, in contrast to the proposal of the above referenced paper. Nevertheless, the present invention may operate with pilot tones, if that is desired.

The invention includes the feature of a multiport amplifier emulation means, which imitates certain aspects, or at least one aspect, of the multiport amplifier, in order to make an assessment of the output signals. Since it is well-known that a multiport amplifier may be represented as a number of matrices (see for example the above referenced paper), this provides a basis for making an emulator, and this may be done in analog form, in digital form, or a mixture of the two.

In one arrangement, the emulation means may be located within the communications satellite, and includes a reverse matrix of the multiport amplifier, which accepts said detected versions and provides outputs corresponding to said input signals. (In analog form, such reverse matrix may comprise two matrices of hybrids, corresponding to the INET and ONET matrices of the MPA, but without the amplifiers). These corresponding signals will however be distorted to an extent depending on cross-talk contributions arising from within the multiport amplifier. Such corresponding signals may be applied to a signal processing means, preferably a digital signal processor, in addition to the actual input signals, and an assessment is carried out of the cross-talk contributions. Essentially the signal processor may carry out a spectrum analysis of the cross-talk contributions, and estimate a condition of the MPA, that would produce such cross-talk contributions. To do this, the signal processor may incorporate a model of the MPA to which virtual inputs may be applied and virtual outputs, together with cross-talk components, measured. The signal processor may therefore be regarded as an emulator, in the sense that it imitates an MPA. This may result in certain conclusions as to required phase and gain adjustments to the multiport amplifier. The present invention recognizes that since signal analysis is required of real communications signals then some form of frequency dependent analysis will need to be performed to process the various unwanted contributions that appear. This function would enable a simple comparison of the components coming back with what went in. Frequency components not present in the input signal must have come from the other channels. Although the frequency content will vary over time, as the signal content changes, the present invention recognizes that if analysis is carried out at baseband on the modulation signal downconverted from RF, then an FFT based approach may be employed, which is manageable at baseband in terms of processing requirements.

Nevertheless, since the provision of a digital signal processor may add significantly to the on-board processing payload of the satellite, it is preferred in accordance with a further feature of the invention to provide the emulation means, at least in part, at a ground station, and to provide a telemetry link to the ground station. In a preferred arrangement, said reverse matrix means is retained in the satellite, in order to extract the cross-talk contributions from the output signals, and these contributions are transmitted via the telemetry link to signal processing means located on the ground station. The ground station in addition requires knowledge of the input signals. These may conveniently be provided by monitoring the uplink transmission signals at the ground station, which will be the basis of the inputs to the multiport amplifier.

In a further feature of the invention, a plurality of multiport amplifiers may be monitored and adjusted employing said emulation means. Selector switch means are provided to sequentially provide detected versions of the output signals of the various multiport amplifiers to the emulation means. Similarly selector switches are provided to selectively route adjustment commands to the respective multiport amplifiers.

BRIEF DESCRIPTION OF THE DRAWINGS

Preferred embodiments of the invention will now be described with reference to the accompanying drawings, wherein:

FIG. 1 is a block diagram of an 8 port multiport amplifier (MPA) of known construction for use in a telecommunications satellite;

FIG. 2 is a schematic of a hybrid used in the MPA of FIG. 1;

FIG. 3 is a block diagram illustrating the concept of the present invention;

DESCRIPTION OF THE PREFERRED EMBODIMENTS

Figure 4:
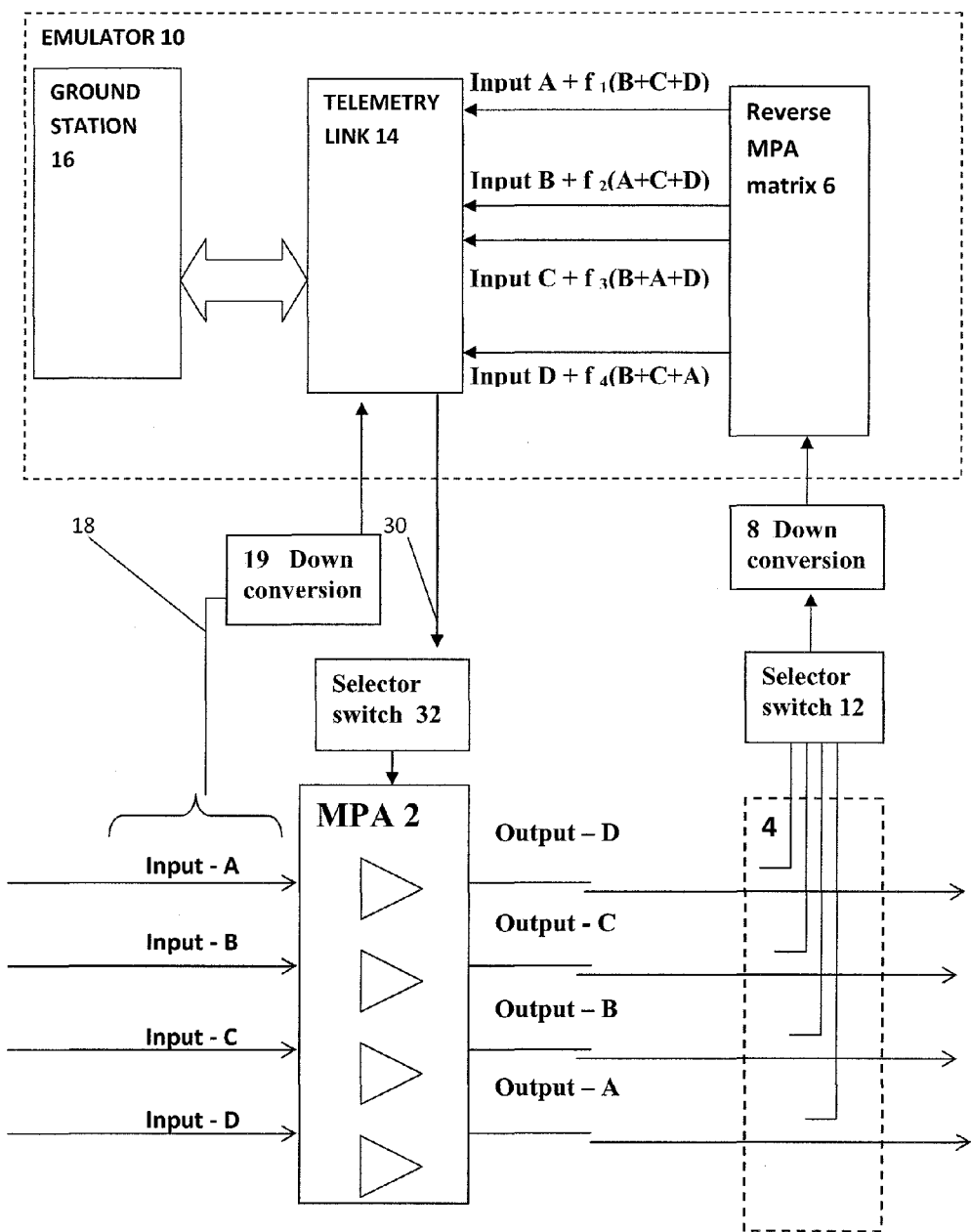
FIG. 4 is a block diagram of a first embodiment of the invention, employing a telemetry link to ground station emulation circuits for a multiport amplifier.

A diagram of an 8 port MPA is shown in FIG. 1, having eight input ports p1-p8 and eight output ports q1-q8. It comprises a set of 3 columns t, x, y of 4 input hybrids A-M, a single column A of 8 amplifiers A1-A8, and a set of 3 columns t',x',y', of 4 output hybrids a-m. The 3 columns t, x, y of 4 input hybrids A-M are referred to as an input network and the 3 columns t',x',y', of 4 output hybrids a-m are referred to as an output network. The MPA also includes a set of gain and phase adjusters G, Θ, for separate adjustment of each amplifier.

A circuit definition of an hybrid (input or output hybrid) is presented in FIG. 2. The input and output signals, p1 & p2 and q1 & q2, are assumed to be complex. The hybrid transfer function is represented thus:

$$\begin{pmatrix} q1 \\ q2 \end{pmatrix} = \begin{pmatrix} C_{11} & C_{12} \\ C_{21} & C_{22} \end{pmatrix} \begin{pmatrix} p1 \\ p2 \end{pmatrix} \quad (1)$$

where $C_{11}$, $C_{12}$, $C_{21}$, $C_{22}$ are all invariable complex coefficients which can be represented as follows:

$$C_{11}=r_{11} \cdot \exp j \cdot \theta_{11}, C_{12}=j \cdot r_{12} \cdot \exp j \cdot \theta_{12}, C_{21}=j \cdot r_{21} \cdot \exp j \cdot \theta_{21}, C_{22}=r_{22} \cdot \exp j \cdot \theta_{22} \quad (2)$$

Ideally for a perfect hybrid all $r=1/\sqrt{2}$, and all $\theta=0$, and the transfer matrix becomes:

$$T = 1/\sqrt{2} \begin{pmatrix} 1 & j \\ j & 1 \end{pmatrix} \quad (3)$$

The amplifiers are assumed to be perfectly linear with complex gain A, represented by function:

$$A = G \cdot \exp j \cdot \Theta \quad (4)$$

Ideally in a MPA transponder all amplifiers are matched and have the same value of G and $\Theta$. However in practice, over time values of G and $\Theta$ will change, and correction is necessary, otherwise significant cross-talk components may be present in MPA output signals. Phase and Gain adjuster circuits are placed in the individual signal paths immediately before the amplifiers A (not shown).

The described embodiments of the invention relate to adjustment of such gain and phase adjusters. In the embodiments described with reference to the Figures, rather than using injected pilot tones, communications signals that occur during normal use of the MPA are employed to determine the required gain and phase adjustments. These signals are sensed at the MPA outputs and downconverted to bring the sensed MPA outputs to baseband, i.e. just the modulated signal that is going through the MPA, not the carrier.

Although the described embodiments relate to the use of communication signals in the determination of gain and phase adjustments, the invention is also applicable to the use of other signals such as injected pilot tones, as described in more detail below.

A digital model off-line is employed in the preferred embodiments and tuned as desired. The model is initially based on the perfect transfer matrix of the MPA with additional terms to produce the same result as the best MPA that can be built. There is an in-orbit tune up phase as the satellite is commissioned.

In use, the digital model may be run in a ground based computer and adjusted to imitate the operation of the MPA under test. Input signals corresponding to those applied to the MPA under test can be applied to the digital model and the model adapted to determine necessary adjustments of the gain and phase characteristics of the MPA under test. By running the model on the ground, all that would generally need to be sent to the satellite, via a telemetry link, which may be a communications channel of the satellite reserved for system functions, is the required gain and phase settings for each MPA. In particular, the communication signal inputs to the MPAs are available in the ground station, since they are to be up-linked to the satellite. The only elements needed on the satellite are the sensing means whereby the MPA outputs are sensed. However, in preferred embodiments of the invention, to minimise the data to be sent to the ground based model, an inverse matrix model is located onboard the satellite, which receives the output signals from the MPA under test and applies a reverse transfer function corresponding to ideal MPA characteristics.

Satellites may operate using multiple MPAs, each having an input network, a group of amplifiers and an output network. In such circumstances, rather than have an inverse matrix for each MPA, a co-ax switch network (small signal level switches) "polls" a single inverse matrix round each of the MPAs as each is required to be adjusted. This minimises downconversion circuitry and inverse matrix circuitry.

By sensing the outputs and by running an emulator process off-line then the auto tune up process does not interfere with normal operation of the satellite. In the event that the tune up system fails there would not be any catastrophic loss of communications capacity.

Referring now to FIG. 3, which is a schematic demonstrating a principle of operation of the invention, inputs A-D are applied to an MPA 2. Outputs D-A, which are amplified versions of the inputs, are sensed as at 4 and applied to a model 6 of MPA 2, in the sense that it is an inverse or reverse matrix, which accepts sensed inputs D-A, and provides as outputs, signals corresponding to original input signals A-D, except that they are polluted with cross-talk contributions a, b, c, d from the other input signals. Thus these corresponding signals are represented as A+b+c+d, B+a+c+d, C+a+b+d, D+a+b+c. Inverse matrix 6 is constituted by hybrid networks, but no amplifiers are provided. Matrix 6 may be regarded as part of an emulation mechanism, in that it imitates the desired operation of MPA 2, in order to reproduce signals corresponding to the input signals, with added cross-talk components.

Figure 5:
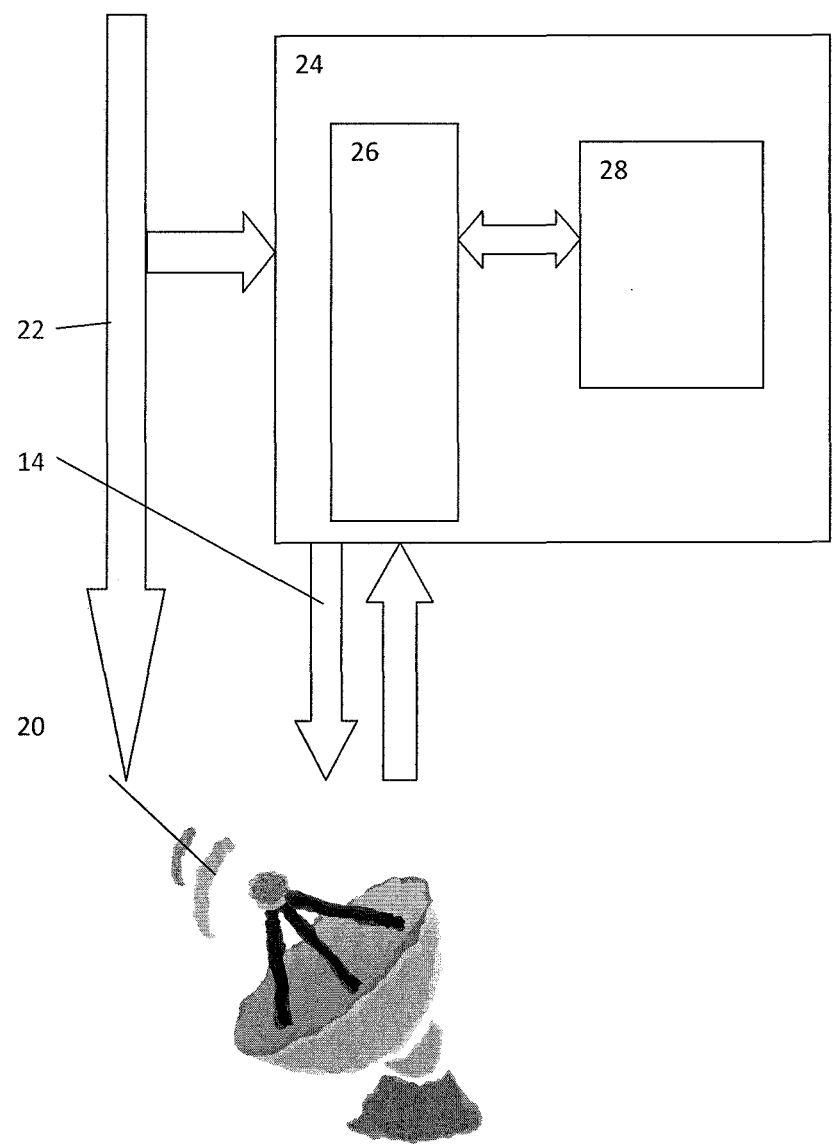
FIG. 5 is a conceptual diagram of the ground station of the second embodiment.

Referring now to FIGS. 4 and 5, these are block diagrams of a first embodiment of the invention, where similar parts to those of FIG. 3 are denoted by the same reference numeral. Input signals A-D are communications signals that occur during regular use of the communications satellite, and are modulated onto an RF carrier so as to be positioned in the appropriate microwave band. In order to monitor the sensed output signals D-A, the signals are down-converted at 8 in order to bring the signals down to base band, and in order to reduce the requirements of processing circuitry. The processing circuitry is indicated generally as emulator 10, in dotted lines. In the event that it is desired to monitor and adjust several MPAs within the communications satellite, a selector switch 12 couples the selected MPA 2 to emulator 10, in a sequential process in which each MPA is adjusted.

Emulator 10 includes reverse MPA matrix 6, and the signals Input A+$f_1$(B+C+D), Input B+$f_2$(A+C+D), Input C+$f_3$(B+A+D), Input D+$f_4$(B+C+A), output from matrix 6, corresponding to input signals A-D, are input to a telemetry link 14 for transmission to a ground station 16. Link 14 may comprise a communications channel reserved for system functions. Prior to transmission, the input signals A-D are applied to link 14 on line 18 and these signals are down-converted to baseband at 19. An error measurement function (not illustrated) calculates % values for the wanted and unwanted signals. These are telemetered to the ground station.

The ground station 16 is shown in more detail in FIG. 5, as including an uplink antenna 20 for transmitting uplink signals on lines 22, and for supporting telemetry link 14. Uplink signals on line 22 and cross-talk component signals on link 14 are applied to a digital signal processor 24. Processor 24 includes a spectrum analysis FFT processor 26, which analyses the cross-talk contributions in terms of their frequency components. Processor 24 also includes a model 28 of MPA 2. The processor operates by modifying the characteristics of the model 28 to determine what characteristics of an MPA would result in the actual cross-talk components $f_1$-$f_4$ observed. These characteristics include the gain and phase of the amplifiers within the MPA 2 over the operational range of the MPA 2.

Once having determined the current characteristics of MPA 2, adjustments may be determined to improve the isolation characteristics of MPA 2, and to reduce cross-talk components $f_1$-$f_4$. Necessary command signals to gain and phase adjusters within MPA 2 are applied via telemetry link 14 to command line 30 within the satellite, as shown in FIG. 4. Selector switch 32 applies the command signals to the MPA currently under test, which is MPA 2 in the present example. In the present example, gain and phase adjustments for each of the amplifiers in the MPA 2 are provided, although in alternative examples the gain and/or phase characteristics of only one or a subset of the amplifiers in a particular MPA 2 can be adjusted.

Figure 6:
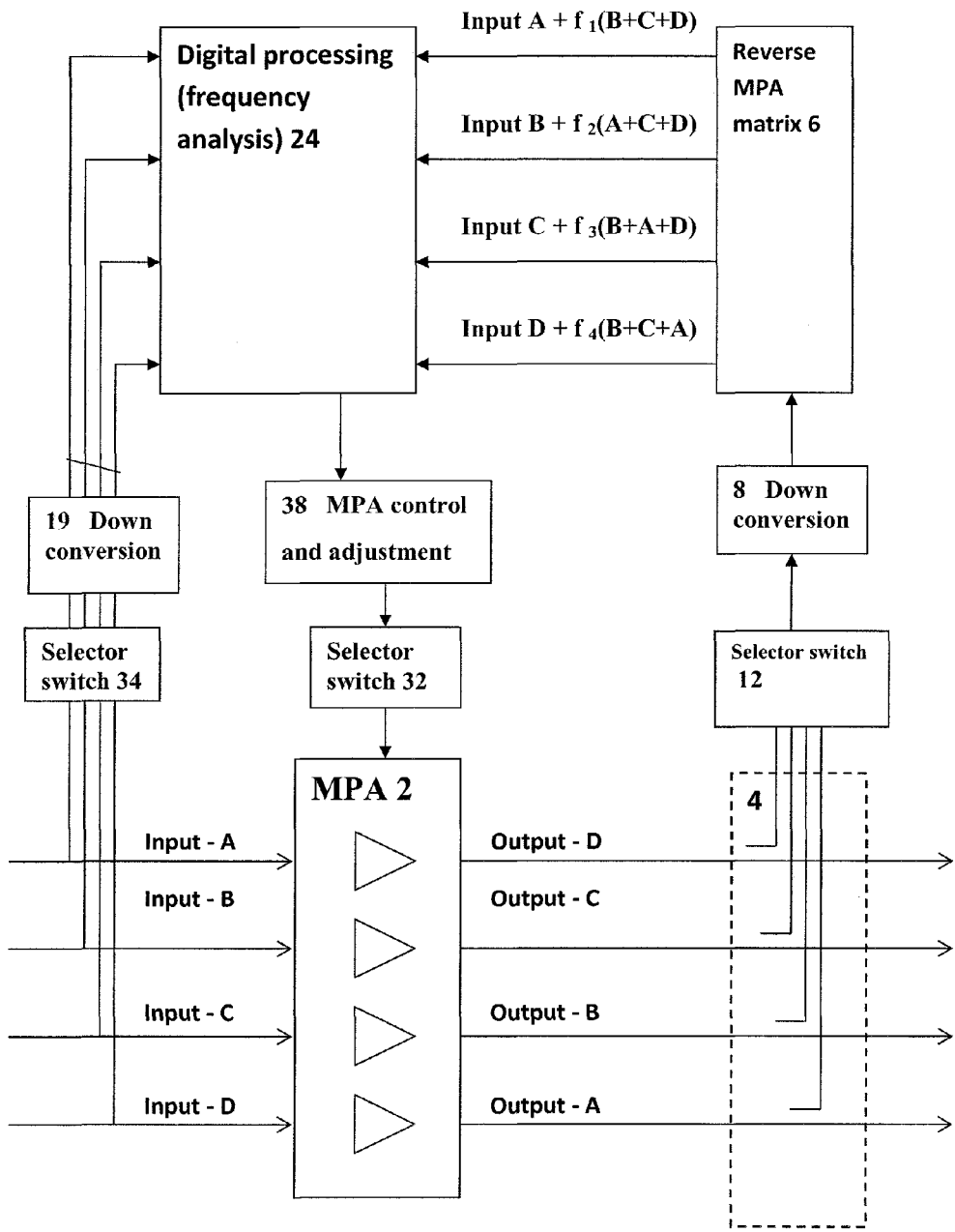
FIG. 6 is a block diagram of a second embodiment of the invention, employing on-board emulation circuits for a multiport amplifier.

Referring now to the second embodiment shown in FIG. 6, similar parts to those of FIGS. 4 and 5 are denoted by the same reference numeral. In this second embodiment, all processing is carried out on-board the satellite, and digital signal processor 24 is directly coupled to receive the outputs of reverse matrix 6. In addition DSP processor 24 receives the input signals A-D via line 18 and a selector switch 34, which operates synchronously with switches 12, 32. The input signals A to D are down converted at 36 prior to being applied to the digital signal processor 24. DSP processor 24 operates in the same manner as described in the first embodiment and provides analysis result signals to an MPA control and adjustment function 38, which translates the analysis results to gain and phase adjustment signals for the phase and gain adjusters within MPA 2.

Although the described embodiments of the invention relate to the use of communication signals in the determination of the gain and phase adjustments for the MPA under test, the invention is also applicable to the use of other signals, such as injected pilot tones. In this case, a signal generator can be provided at the satellite and arranged to provide pilot tones as the input signals A to D. These can be arranged at a frequency which does not interfere with communications traffic being processed by the MPA under test. Since the gain and phase characteristics of the pilot tones are known, such embodiments would not require sampling of the input signals A to D to be provided to the DSP 24.

The invention claimed is:

1. A method of adjusting the gain and/or phase characteristics of a multiport amplifier of a communications satellite to improve the isolation of signals within the multiport amplifier, the multiport amplifier comprising a plurality of microwave power amplifier units, a plurality of input ports and a plurality of output ports, the input ports being connected to said amplifier units by an input signal dividing network, and the output ports being connected to said amplifier units by an output signal dividing network, so that an input signal at any input port is amplified by all amplifier units, and then recombined into an output signal at an output port, the method comprising:
   providing at least one of said amplifier units with gain adjuster and phase adjuster,
   providing input signals to at least some of said input ports, and detecting resultant output signals at least some of said output ports,
   providing detected versions of said output signals to a multiport amplifier emulator, said emulator comprising a model of the multiport amplifier, the model having modifiable characteristics to determine what characteristics of the multiport amplifier would produce the detected versions of the output signals from the input signals so as to enable cross-talk components within said detected versions to be assessed, and, in response thereto,
   issuing as required adjusting commands to said gain adjuster and/or phase adjuster.

2. A method according to claim 1, wherein said emulator further comprises a reverse matrix of the multiport amplifier, which accepts said detected versions and provides, as outputs, signals corresponding to said input signals.

3. A method according to claim 2, including digitally processing said corresponding signals within said emulator in order to assess said cross-talk components, including making a frequency analysis of said cross-talk components.

4. A method according to claim 3, wherein said model includes a digital representation of said multiport amplifier, in which said cross-talk components are assessed.

5. A method according to claim 3, wherein said digital processing takes place on-board the communications satellite.

6. A method according to claim 3, including providing a telemetry link, and said digital processing takes place at a ground station.

7. A method according to claim 1, wherein said input signals comprise communications signals modulated on a carrier wave, and the method comprising downconverting the detected output signals to provide said detected versions.

8. A method according to claim 1, including providing a plurality of multiport amplifiers, and selecting each of said multiport amplifiers in sequence for said gain and/or phase adjusting.

9. A multiport amplifier arrangement for a communications satellite, comprising:
   a plurality of microwave power amplifier units;
   a plurality of input ports and a plurality of output ports, the input ports being connected to said amplifier units by an input signal dividing network, the output ports being connected to said amplifier units by an output signal dividing network, so that an input signal at any input port is amplified, by all amplifier units, and then recombined into an output signal at an output port, and at least one of said amplifier units having gain adjuster and phase adjuster;
   a detector for detecting output signals at said output ports and for providing detected versions of said detected output signals to a multiport amplifier emulator, said emulator comprising a model of the multiport amplifier, the model having modifiable characteristics to determine what characteristics of the multiport amplifier would produce the detected versions of the output signals from the input signals so as to enable cross-talk components within said detected versions to be assessed, and being arranged to provide adjusting commands to said gain adjuster and/or phase adjuster.

10. A multiport amplifier arrangement according to claim 9, wherein said emulator further comprises a reverse matrix of the multiport amplifier, which accepts said detected versions and provides as outputs, signals corresponding to said input signals.

11. A multiport amplifier arrangement according to claim 10, wherein said emulator comprises a digital signal processor for carrying out an assessment of said cross-talk components.

12. A multiport amplifier arrangement according to claim 11, wherein said digital signal processor includes an FFT processor for carrying out a frequency analysis of said cross-talk components, and a digital representation of said multiport amplifier in which said cross-talk components are assessed.

13. A multiport amplifier arrangement according to claim 11, wherein said digital processor is located on-board the communications satellite.

14. A multiport amplifier arrangement according to claim 11, including a telemetry link from said communications satellite to a ground station, and said digital processor being located at said ground station.

15. A multiport amplifier arrangement according to claim 10, including a plurality of multiport amplifiers, and selection means for selecting each of said multiport amplifiers in sequence for coupling to said multiport amplifier emulator, for adjustment of gain and/or phase.

16. A multiport amplifier arrangement according to claim 9, wherein said emulator comprises a digital signal processor for carrying out an assessment of said cross-talk components, the digital signal processing means includes said model of the multiport amplifier.

17. A multiport amplifier arrangement according to claim 16, wherein said digital signal processor further includes an FFT processor for carrying out a frequency analysis of said cross-talk components, and the model corresponds to a digital representation of said multiport amplifier in which said cross-talk components are assessed.

18. A multiport amplifier arrangement according to claim 16, wherein said digital processor is located on-board the communications satellite.

19. A multiport amplifier arrangement according to claim 16, including a telemetry link from said communications satellite to a ground station, and said digital processor being located at said ground station.

20. A multiport amplifier arrangement according to claim 9, including a plurality of multiport amplifiers, and selection means for selecting each of said multiport amplifiers in sequence for coupling to said multiport amplifier emulator, for adjustment of gain and/or phase.

\* \* \* \* \*